US011934609B2

(12) United States Patent
Zou

(10) Patent No.: US 11,934,609 B2
(45) Date of Patent: Mar. 19, 2024

(54) MULTI-BIAS MODE CURRENT CONVEYOR, CONFIGURING A MULTI-BIAS MODE CURRENT CONVEYOR, TOUCH SENSING SYSTEMS INCLUDING A MULTI-BIAS MODE CURRENT CONVEYOR, AND RELATED SYSTEMS, METHODS AND DEVICES

(71) Applicant: Microchip Technology Incorporated, Chandler, AZ (US)

(72) Inventor: Lei Zou, Langhus (NO)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/301,080

(22) Filed: Mar. 24, 2021

(65) Prior Publication Data

US 2022/0035506 A1 Feb. 3, 2022

Related U.S. Application Data

(60) Provisional application No. 62/706,106, filed on Jul. 31, 2020.

(51) Int. Cl.
*G06F 3/041* (2006.01)
*G05F 3/20* (2006.01)
*G05F 3/26* (2006.01)

(52) U.S. Cl.
CPC .......... *G06F 3/04166* (2019.05); *G05F 3/205* (2013.01); *G05F 3/262* (2013.01)

(58) Field of Classification Search
CPC ...... G06F 3/04166; G05F 3/205; G05F 3/262; H03F 1/308; H03F 2200/91; H03F 3/3022; H03K 17/962; H03K 2217/96073
See application file for complete search history.

(56) References Cited

U.S. PATENT DOCUMENTS 5,124,666 A * 6/1992 Liu ................... H03F 3/3001
330/288
6,147,665 A * 11/2000 Friedman ............ G09G 3/22
345/204

(Continued)

FOREIGN PATENT DOCUMENTS

TW I371676 B 9/2012

OTHER PUBLICATIONS

Al-Absi Munir Ahmad et al: "A New Floating and Tunable Capacitance Multiplier With Large Multiplication Factor", IEEE, vol. 7, (Aug. 2018) pp. 120076-120081.

(Continued)

*Primary Examiner* — Benyam Ketema
(74) *Attorney, Agent, or Firm* — TraskBritt

(57) ABSTRACT

One or more embodiments relate to a multi-bias mode current conveyor. Such a current conveyor may include an input terminal, a reference terminal, an output terminal, a first and second cascoded current mirrors, and a biasing circuit. The first cascoded current mirror and a second cascoded current mirror may be arranged as a current conveyor that is configured to provide an output current that a mirror of an input current. The biasing circuit may be configured to provide a bias voltage selectively exhibiting a first voltage level or a second voltage level. The bias voltage may be provided at least partially responsive to a state of the input current. The biasing circuit may be arranged to apply the bias voltage to at least one of the first cascoded current mirror or the second cascoded current mirror.

23 Claims, 10 Drawing Sheets

(56) References Cited

U.S. PATENT DOCUMENTS

| | | | | |
|---|---|---|---|---|
| 6,219,166 | B1* | 4/2001 | Shang | H04B 10/695 398/9 |
| 10,394,386 | B1* | 8/2019 | Fronczak | G06F 3/0418 |
| 11,081,036 | B1* | 8/2021 | Wang | H03K 5/24 |
| 11,251,761 | B1* | 2/2022 | Saeki | H03F 3/45475 |
| 2002/0186072 | A1* | 12/2002 | Mano | H03L 7/0995 327/538 |
| 2004/0061672 | A1* | 4/2004 | Page | G09G 3/3283 345/82 |
| 2004/0207434 | A1* | 10/2004 | Miura | H03F 3/45237 327/4 |
| 2004/0263504 | A1* | 12/2004 | Kato | H03F 3/4521 345/204 |
| 2005/0156668 | A1* | 7/2005 | Moon | G09G 3/3688 330/261 |
| 2007/0126471 | A1* | 6/2007 | Jeong | G11C 29/028 326/30 |
| 2008/0067991 | A1* | 3/2008 | Lee | G05F 1/575 323/273 |
| 2008/0082290 | A1* | 4/2008 | Jeong | G01K 7/425 374/E7.043 |
| 2008/0290909 | A1* | 11/2008 | Chung | H03K 19/01707 327/108 |
| 2010/0033466 | A1* | 2/2010 | Takahashi | G09G 3/3696 345/94 |
| 2011/0298519 | A1* | 12/2011 | Liu | H03K 3/356113 327/333 |
| 2013/0082936 | A1* | 4/2013 | Islamkulov | H04N 25/75 250/208.2 |
| 2015/0341003 | A1* | 11/2015 | Ciubotaru | H03F 3/45273 330/254 |
| 2016/0026295 | A1* | 1/2016 | Ogirko | G06F 3/04166 345/174 |
| 2016/0134085 | A1* | 5/2016 | Obe | F02P 11/00 123/406.12 |
| 2016/0282890 | A1* | 9/2016 | Malinowski | G05F 1/575 |
| 2017/0032740 | A1* | 2/2017 | Ko | H03F 3/45219 |
| 2018/0144707 | A1* | 5/2018 | Tsuchi | H03F 3/4521 |
| 2019/0064974 | A1* | 2/2019 | Fronczak | G06F 3/0416 |
| 2021/0305954 | A1* | 9/2021 | Chang | H03F 3/45076 |
| 2022/0035506 | A1* | 2/2022 | Zou | H03F 1/308 |

OTHER PUBLICATIONS

Faseehuddin Mohammad et al: "Design of Ultra Low Voltage Low Power DXCCII for Analog Signal Processing", 2018 IEEE International Conference on Semiconductor Electronics (ICSE), (Aug. 2018) pp. 226-229.

International Search Report from International Application No. PCT/US2021/070301, dated Jul. 2, 2021, 6 pages.

International Written Opinion from International Application No. PCT/US2021/070301, dated Jul. 2, 2021, 11 pages.

Jiana L et al: "An improved integrated lossless self-matched current-sensing circuit based on Gm-C filter for 4-switch buck-boost topology", Tencon 2010—2010 IEEE Region 10 Conference, Piscataway, NJ (Nov. 2010) pp. 1548-1553.

Jiraseree-Amornkun et al: "Efficient implementation of tunable ladder filters using multi-output current controlled conveyors", AEU—International Journal of Electronics and Communications, Amsterdam, NL, vol. 62, No. 1 (Dec. 2007) pp. 11-23.

Khateb Fabian: "The experimental results of the bulk-driven quasi-floating-gate MOS transistor", AEU—International Journal of Electronics and Communications, Amsterdam, NL, vol. 69, No. 1, (Oct. 2014) pp. 462-466.

Marquez A et al: "A CMOS low-power widely programmable active RC filter based on a hybrid CS/D network", 2017 European Conference on Circuit Theory and Design (ECCTD), (Sep. 2017) pp. 1-4.

\* cited by examiner

MULTI-BIAS MODE CURRENT CONVEYOR, CONFIGURING A MULTI-BIAS MODE CURRENT CONVEYOR, TOUCH SENSING SYSTEMS INCLUDING A MULTI-BIAS MODE CURRENT CONVEYOR, AND RELATED SYSTEMS, METHODS AND DEVICES

CROSS-REFERENCE TO RELATED APPLICATION

This application claims the benefit under 35 U.S.C. § 119(e) of U.S. Provisional Patent Application Ser. No. 62/706,106, filed Jul. 31, 2020, the disclosure of which is hereby incorporated herein in its entirety by this reference.

FIELD

Embodiments discussed herein relate, generally, to current mode circuits such as current conveyors. Some embodiments relate to so called "second generation" current conveyors (sometimes also called a "second-generation current controlled conveyor"). Some embodiments relate to touch sensing systems that include or co-operate with embodiments of current mode circuits and current conveyors discussed herein.

BACKGROUND

A current conveyor is an electronic device, and more specifically, an electronic amplifier that has a predetermined current gain, e.g., unity gain, without limitation. Current conveyors are a type of current mode circuit in that a response of such a circuit is primarily determined by currents (e.g., characteristics of a current signal such as amplitude, peak amplitude), and inputs and outputs of such a circuit include currents.

Current-mode circuits and working with currents more generally, offer advantages over voltage-mode circuits and working with voltages. As non-limiting examples, compared to voltage mode circuits, performance of a current conveyor shows higher bandwidth and higher slew rate, which is desirable when driving capacitive loads. Moreover, certain operations are more efficiently (e.g., require fewer electronic components, without limitation) performed using currents instead of voltages, such as replication, scaling, and summing of current signals. Current conveyors are often suited for high frequency applications where there's a need for an electronic device that is compact and power efficient.

In electronic circuit design, when arranged with other electronic components of a system, a current conveyor may provide analogue signal processing functions in various applications, including where high frequency with low power consumption is desirable, such as wired, wireless, and optical communication and applications thereof.

One application for current conveyors is capacitive touch sensing systems that are configured to detect the proximity of conductive objects at or near a touch sensor (i.e., a "touch"). Current signals that are indicative of capacitance and/or changes in capacitance at a touch sensor are provided to a touch controller and used to detect the proximity of an object (i.e., a "touch"). Current conveyors are sometimes used along the signal paths of such current signals.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
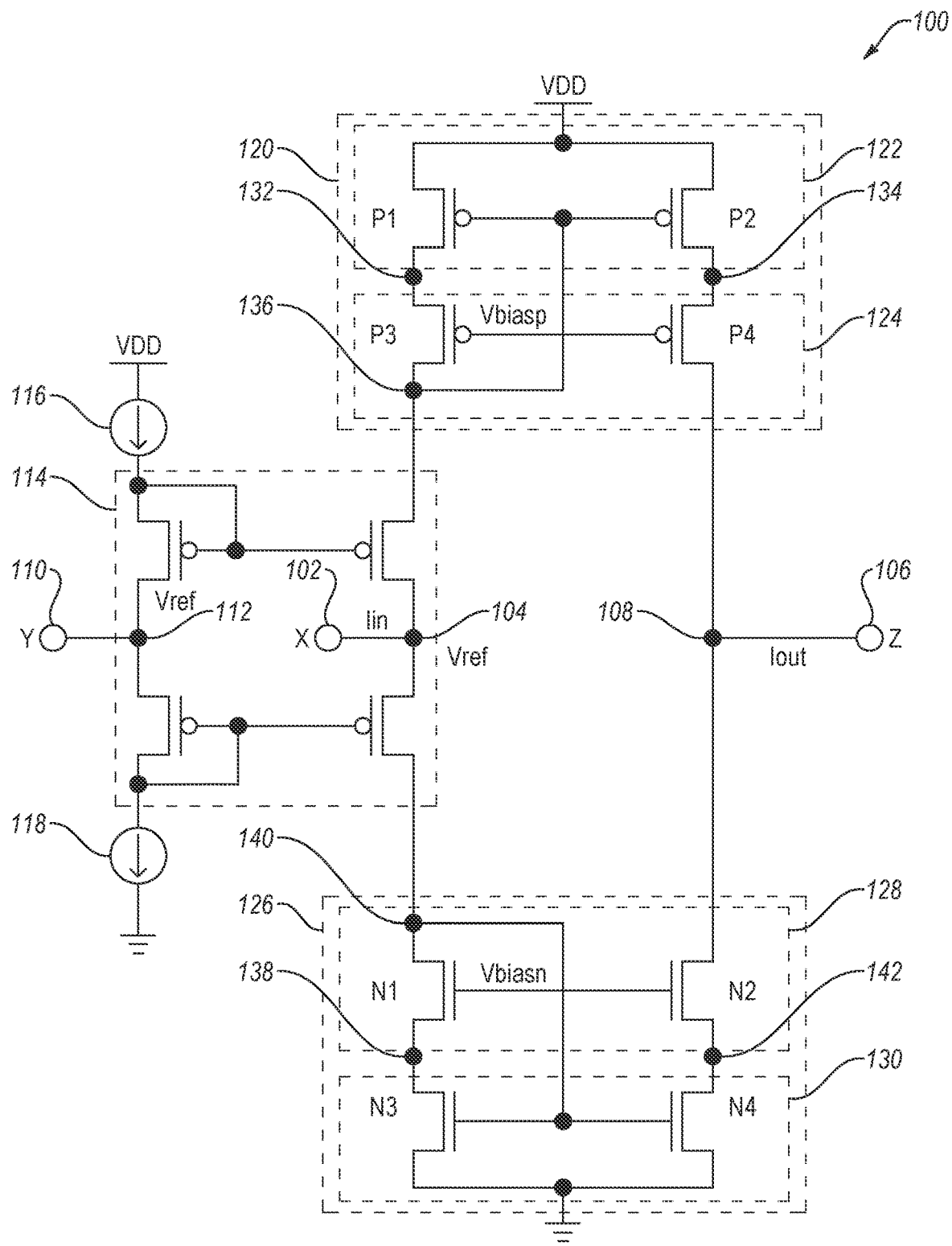
FIG. 1 is a schematic diagram depicting a current conveyor in accordance with the state of the art known to the inventor of this disclosure.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein—all of which are encompassed by use of the term "processor." A general-purpose processor may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code, without limitation) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," etc., is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

FIG. 1 is a circuit diagram depicting a current conveyor 100, in accordance with the state of the art as known to the inventor of this disclosure. Current conveyor 100 is configured, generally, to provide an output current at output terminal 106 that is a mirror of an input current received at input terminal 102, with low (in theory, zero) input impedance at input terminal 102 and high (in theory, infinite) output impedance at output terminal 106. Current conveyor 100 is an example of what is sometimes referred to as a "second generation current conveyor" and as a "second-generation current controlled current conveyor." A degree to which the output current Iout mirrors the input current Iin depends on a gain for current conveyor 100. As a non-limiting example, in case of unity gain the output current Iout is substantially a replica of the input current Iin. Current conveyors having other gains (multiples or fractional) are specifically contemplated and do not exceed the scope of this disclosure.

As depicted by FIG. 1, current conveyor 100 includes voltage follower 114, first cascoded current mirror 120, and second cascoded current mirror 126.

Voltage follower 114 is configured, generally, to provide an output voltage having a voltage level that is substantially equal to a voltage level of an input voltage (i.e., perform unity voltage gain). More specifically, voltage follower 114 of current conveyor 100 is arranged to apply a reference voltage Vref of reference node 112 to input node 104 such that respective voltages at reference node 112 and input node 104 are substantially the same. In the specific non-limiting example depicted by FIG. 1, voltage follower 114 includes a number of elements (here, pairs of nMOS and pMOS transistors) arranged to form a translinear loop for performing the function of voltage follower 114 (i.e., applying Vref to input node 104) in response to direct currents (DC) of first DC bias current source 116 and second DC bias current source 118. DC currents from first DC bias current source 116 and second DC bias current source 118 are substantially equal and determine, at least in part, the DC current for the translinear loop, and more generally facilitate a high-impedance reference terminal, here, reference terminal 110.

Reference voltage Vref is supplied to voltage follower 114 via reference terminal 110 coupled to reference node 112, as a non-limiting example, by an off-circuit voltage source (not shown).

Cascoded current mirrors such as first cascoded current mirror 120 and second cascoded current mirror 126 are configured, generally, to alternately mirror the current at input node 104 (which input current is a bidirectional pulsed current) at output node 108 (e.g., to provide a current (the "controlled current") at output terminal 106 such that a ratio between a current at output terminal 106 and a current (the "control" current) at input node 104 is within a specified threshold, without limitation). Input node 104 is coupled to output node 108 via first cascoded current mirror 120 and second cascoded current mirror 126. First cascoded current mirror 120 and second cascoded current mirror 126 are a p-side folded cascode current mirror (here including transistors labeled P1, P2, P3, and P4) and n-side folded cascode current mirror (here including transistors labeled N1, N2, N3, and N4), respectively.

First cascoded current mirror 120 includes a first cascode stage 124 (gate-coupled transistors P3 and P4) coupled to a first current mirror 122 (gate-coupled transistors P1 and P2). Left and right portions of first cascoded current mirror 120 are referred to herein as left portion of first cascoded current mirror 120 (which includes transistors P1 and P3) and right portion of first cascoded current mirror 120 (which includes transistors P2 and P4). First cascode stage 124 is arranged so that $Vds_{p1}$ and $Vds_{p2}$ are equal, in other words, there is an equal voltage drop from VDD to node 132 and node 134. Respective gates of gate-coupled transistors P3 and P4 are coupled to a source of a fixed bias voltage $Vbias_p$ (source not shown). Respective gates of gate-coupled transistors P1 and P2 are coupled to a drain of transistor P3 such that transistor P2 can mirror the current flowing through transistor P1 (i.e., $Ids_{p2}$ mirrors $Ids_{p1}$).

A voltage $V_B$ at node 132 is expressed as $V_B = Vbias_p + Vsg_{p3} + Ipeak*Ron_{p3}$. Resistance $Ron_{p3}$ is the ON-resistance of transistor P3, and a value of resistance $Ron_{p3}$ at least partially depends on whether transistor P3 operates in a saturation region or a linear region, i.e., a value of resistance $Ron_{p3}$ is different if transistor P3 operates in a saturation (also sometimes referred to as an "active region" for p- and n-channel type Metal Oxide Field Effect Transistor (MOSFET) devices) or a linear region. In this manner, resistance $Ron_{p3}$ brings a dynamic effect to current conveyor 100 and more specifically to first cascoded current mirror 120. As expressed by the equation for voltage $V_B$, above, a voltage $V_B$ at node 132 increases with increases in current Ipeak, and a voltage $Vsd_{p1}$ across a source-drain of transistor P1 decreases ($V_{sdp1} = V_{DD} - V_B$) with the voltage $V_B$ at node 132. Moreover, a voltage is realized at node 136 in response to the current Ipeak at input terminal 102. An amount of a voltage drop from VDD to node 136 may be expressed as $Ipeak*(Ron_{p3} + Ron_{p1})$, where $Ron_{p3} + Ron_{p1}$ represents the resistance from node 136 (P3 drain) to VDD. The voltage level realized at node 136 increases the source-gate voltage $Vsg_{p1}$ of transistor P1. When sufficiently large voltages are realized at node 132 and node 136 and across a source-drain and source-gate of transistor P1, then transistor P1 may operate in a linear region. Transistor P1 operating in a linear region may result in inaccurate current mirroring from transistor P1 to transistor P2.

A size of transistors P3 and P1 may be increased to change characteristics of the CMOS transistors, however increased size brings undesirable trade-offs such as cost. The inventor of this disclosure appreciates a need for general purpose current conveyors that can handle a range of amplitudes (e.g., Ipeak to −Ipeak) of an input current without some or all of the undesirable dynamic effects noted above.

The discussion about first cascoded current mirror 120, first current mirror 122, first cascode stage 124, node 132, node 134, node 136, and transistors P1, P2, P3 and P4 also applies to second cascoded current mirror 126, second cascode stage 128, second current mirror 130, node 138, node 142, node 140, and transistors N1, N2, N3, and N4 with appropriate adjustments known to a person having ordinary skill in the art based on an nMOS configuration of second cascoded current mirror 126.

Figure 2:
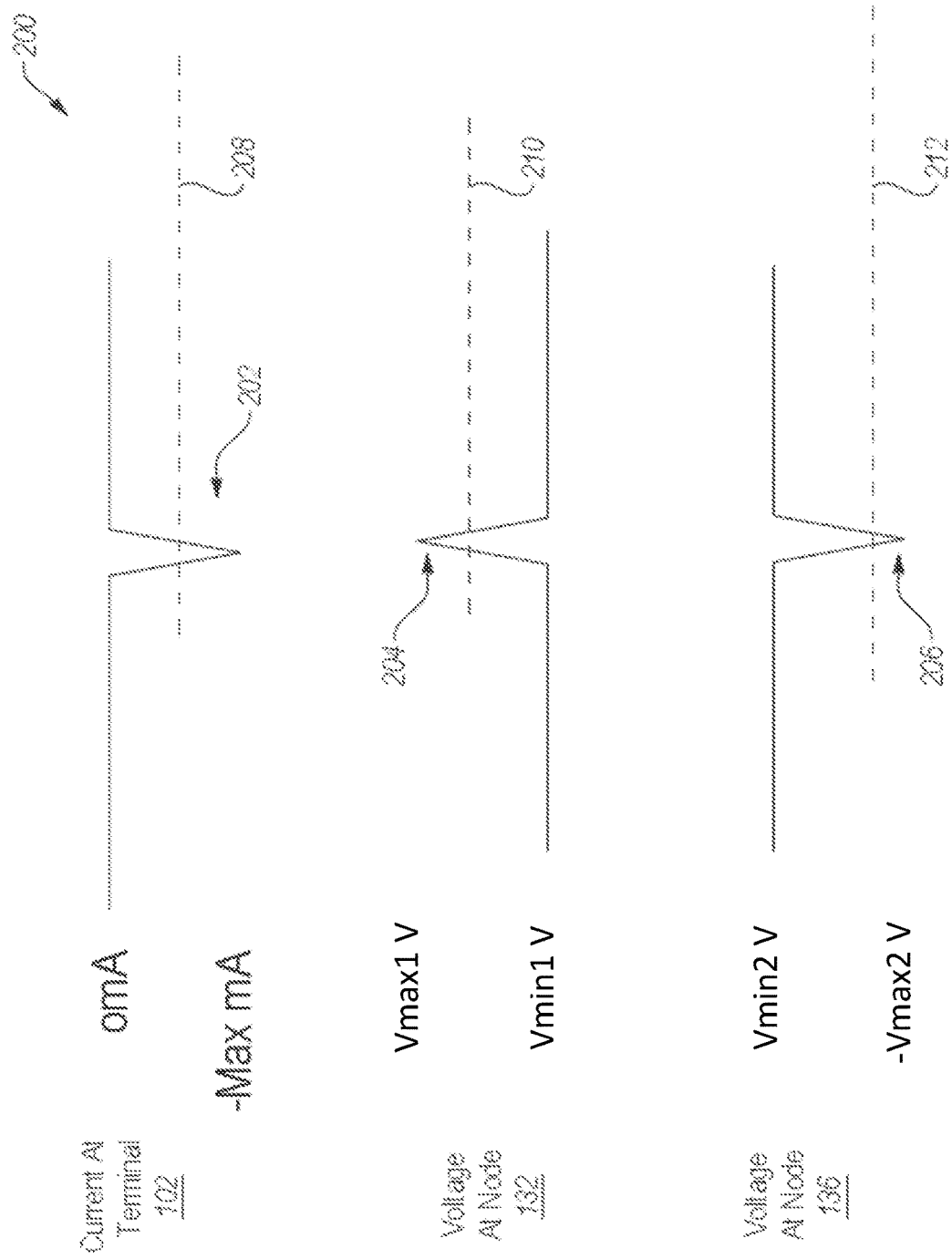
FIG. 2 is a signal diagram depicting various signals of an aspect of the subject matter in accordance with one or more embodiments.

FIG. 2 is a diagram depicting an input current (Iin) flowing from input terminal 102 to input node 104 and corresponding voltages at node 132 (voltage $V_B$) and node 136, as a specific non-limiting example that illustrates a concern with conventional current conveyors discussed above. The depicted input current $I_{in}$ is a portion of a bidirectional pulsed current (a current that reverses direction, also called "commutating") that, in this example, is 0 mA for a first time duration, a current pulse 202 forms during a second time duration, and then is 0 mA for a third time duration until, optionally, another current pulse is formed. Negative and positive refer to the direction that $I_{in}$ flows, in this specific example 0 to −Max mA indicates flow from input node 104 to input terminal 102, and 0 to Max mA indicates flow from input terminal 102 to input node 104. During the current pulse 202, $I_{in}$ changes from 0 to −Max mA and then −Max mA to 0, where current level "Max" is an arbitrary current level that is greater than threshold 208. Voltage pulse 204 from Vmin1 V (e.g., 2 V, without limitation) to Vmax1 V is formed at node 132 in response to current pulse 202 forming at input terminal 102, and voltage pulse 206 from Vmin2 V (e.g., 2.8 V, without limitation) to Vmax2 V is formed at node 136 in response to current pulse 202 at input terminal 102. Based on the relationships discussed above between $Vsd_{p1}$, $Vsg_{p1}$, $Vbias_p$, and $V_B$, transistor P1 will operate in a linear region as threshold 208, threshold 210, and threshold 212 are reached, and cause some of the undesirable dynamic effects discussed above.

Figure 3A:
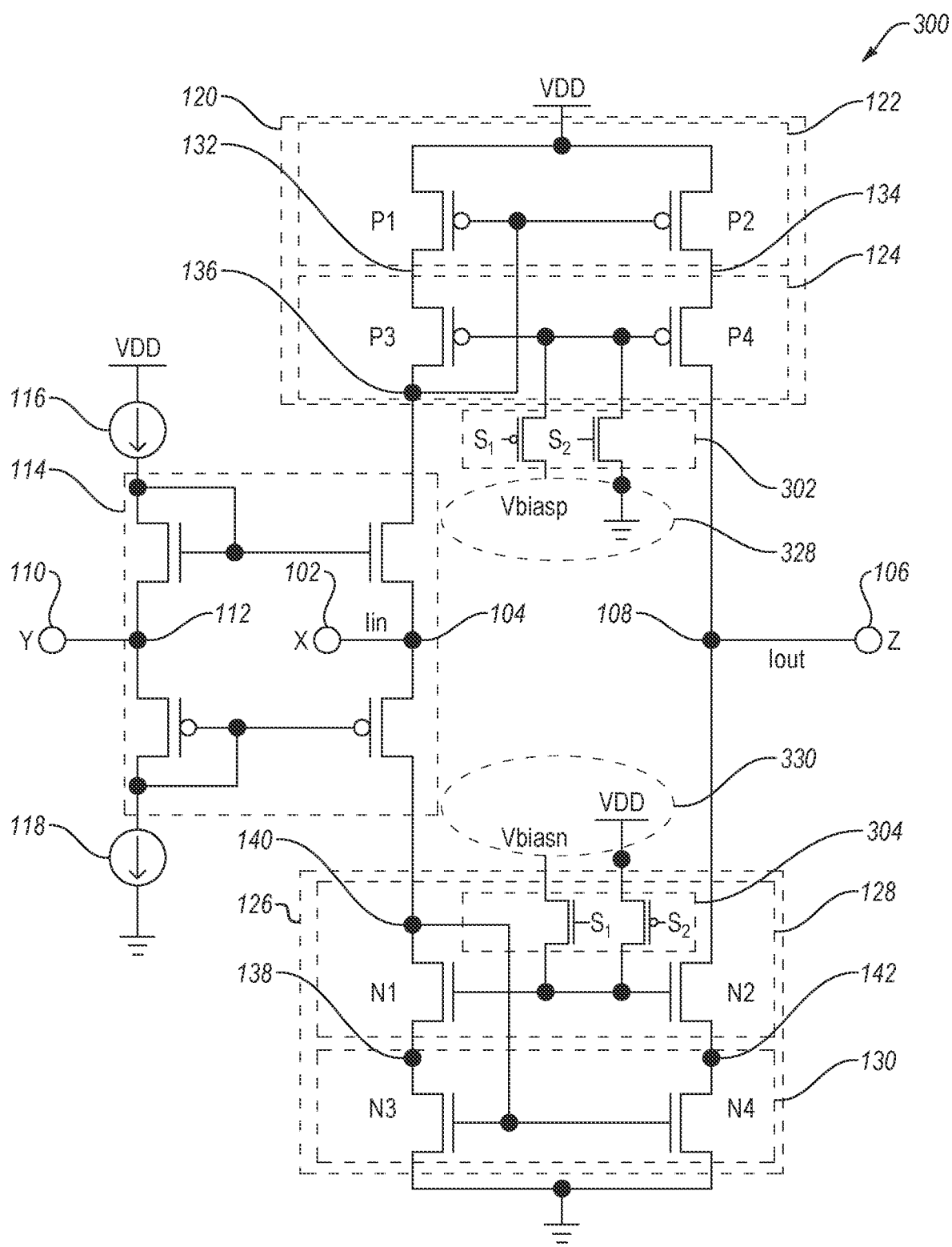
FIG. 3A is a schematic diagram depicting a current conveyor in accordance with one or more embodiments.

FIG. 3A is a circuit diagram depicting a multi-bias mode current conveyor 300 in accordance with one or more embodiments. The description herein of elements depicted by FIG. 1 should be understood to apply to elements having like reference labels depicted by FIG. 3A and are not described again solely to avoid unnecessary duplication. Notably, while a bias voltage exhibiting a fixed voltage level is applied to gate-coupled transistors P3, P4 and N1, N2, respectively, of the cascode stages depicted by FIG. 1, a voltage level exhibited by bias voltages of disclosed embodiments of multi-bias mode current conveyor 300 is configurable and not necessarily fixed.

In one or more embodiments, a bias voltage selectively exhibiting a first or a second voltage level may be applied to respective gates of gate-coupled transistors P3 and P4, automatically (auto-selection). Applying the disclosed bias voltage may maintain operation of transistor P1 in a saturation region during periods where a level of a voltage at node 132 in response to a level of a current at input terminal 102 might otherwise cause transistor P1 to operate in a linear region. Such as a bias voltage may be applied in response to an enabled bias mode of the multi-bias mode current conveyor.

Generally, each bias mode specifies voltage levels exhibited by a bias voltage and various states of an input current that trigger the respective voltage levels. In some embodiments, voltage levels may be internally pre-configured at the current conveyor by coupling switches S1 and S2 to internal or external voltage sources and/or to tuning circuitry for adjusting the voltage levels, and thereby supply a desired one of Vbiasp, Vbiasn, VDD, and ground. In such embodiments, a bias mode may specify states (ON/OFF) of switches S1 and S2 based on observed states of the input current, and internal logic of the current conveyor may provide a drive signal to turn the switches S1, S2 ON or OFF according to configured bias mode. While multiple voltage sources for the bias voltage are depicted and discussed herein, any suitable technique or architecture may be used to supply or generate the bias voltage without exceeding the scope of this disclosure, such as a switching power supply, a switching regulator, or a low-dropout linear regulator, without limitation.

In the specific non-limiting embodiment depicted by FIG. 3A, in the case of first cascoded current mirror 120, a bias voltage selectively exhibiting a first or second voltage level (here, equal to $Vbias_p$ or ground) may be applied to respective gates of gate-coupled transistors P3 and P4 by biasing circuit 302. Similarly, in the case of second cascoded current mirror 126, a bias voltage selectively exhibiting a third or fourth voltage level (here, equal to $Vbias_n$ or VDD) may be applied to respective gates of gate-coupled transistors N1 and N2 by biasing circuit 304. While separate circuits are shown in the specific embodiment by FIG. 3A, in other embodiments it is specifically contemplated that biasing circuit 302 and biasing circuit 304 may be the same circuit configured to provide the disclosed voltage levels (e.g., $Vbias_p$, $Vbias_n$, VDD and/or ground, without limitation).

Biasing circuit 302 and biasing circuit 304 may each include a selection circuit for coupling to first and second voltage sources 328 and third and fourth voltage sources 330, respectively. Such a selection circuit is depicted by FIG. 3A as switch S1 for coupling to a voltage source for $Vbias_p$/$Vbias_n$ (source not shown) and switch S2 for coupling to ground/VDD. Disclosed bias voltages may selectively exhibit additional voltages levels to those discussed with respect to FIG. 3A, and biasing circuit 302 and 304 may be arranged to provide (e.g., apply, without limitation) a selected voltage level to respective gates of gate-coupled transistors P3 and P4 and gate-coupled transistors N1 and N2. More than two available bias voltages/voltage levels and selection circuitry for providing the same does not exceed the scope of this disclosure and is specifically contemplated.

In a contemplated operation, it may be appropriate to select $Vbias_p$/$Vbias_n$ in cases when an amplitude of an input current (i.e., Ipeak) is, or is expected to be, smaller than a threshold current amplitude (i.e., in response to a first state of the input current), and appropriate to select ground/VDD in cases when an amplitude of an input current is, or is expected to be, at or larger than a threshold current amplitude (i.e., in response to a second state of the input current). Using the expression for $V_B$ discussed above and $Vbias_p$, in a case of a large input current (i.e., a current amplitude larger than a threshold current amplitude) GND is selected for the transistor P3 gate (S2 is ON and S1 is OFF), P3 operates in a linear region, and the voltage $V_B$ at node 132=the voltage at node 136. The influence of $Ron_{p3}$ on $Ipeak*Ron_{p3}$ when transistor P3 is in a linear region is removed, and so the dynamic factor is removed. Transistor P1 operates in a saturation region.

In a case of a small input current (i.e., a current amplitude smaller than a threshold current amplitude) $V_B$=$Vbias_p$+$Vsg_{p3}$+$Ipeak*Ron_{p3}$, and transistor P1 operates in a saturation region.

Notably, FIG. 3A depicts a multi-bias mode current conveyor 300 that is configured as a current conveyor 100 of FIG. 1 and includes biasing circuits 302/304. The biasing circuits 302/304 each include respective transistor switches, switch S1 and switch S2. When an enablement signal received at a switch changes from de-asserted to asserted (labels "S1" and "S2" in FIG. 3 may be understood to refer to individual switches and their respective enablement signals) a switch turns "ON" and will apply $Vbias_p$/$Vbias_n$ or ground/VDD to respective gates of gate-coupled transistors P3 and P4 or N1 and N2. When an enablement signal changes from asserted to de-asserted a switch turns "OFF" and does not apply $Vbias_p$/$Vbias_n$ or ground/VDD to respective gates of gate-coupled transistors P3 and P4 or N1 and N2. While the specific non-limiting embodiment of FIG. 3 depicts individual enablement signals for respective active "high" switches of biasing circuits 302/304, that is not intended to limit this disclosure to any specific number of enablement signals or switch configuration. Any suitable arrangement may be used, including, as a non-limiting example, an embodiment where one of S1 and S2 is configured as an active "high" switch and the other is configured as an active "low" switch, and the pair of switches are arranged to enable/disable at least partially in response to a same enablement signal such that when one switch is ON the other switch is generally OFF.

In some embodiments of a multi-bias mode current conveyor, voltage follower 114 includes one or more of input terminal 102 and input node 104, and in some embodiments of a multi-bias mode current conveyor, a voltage follower 114 does not include one or more of input terminal 102 and input node 104.

As discussed above, disclosed current conveyors such as current conveyor 300, without limitation, are not limited a specific gain. As non-limiting examples, disclosed current conveyors may be configured for unity (i.e., gain=1), multiple (i.e., gain>1), or fractional (i.e., gain<1).

Figure 3B:
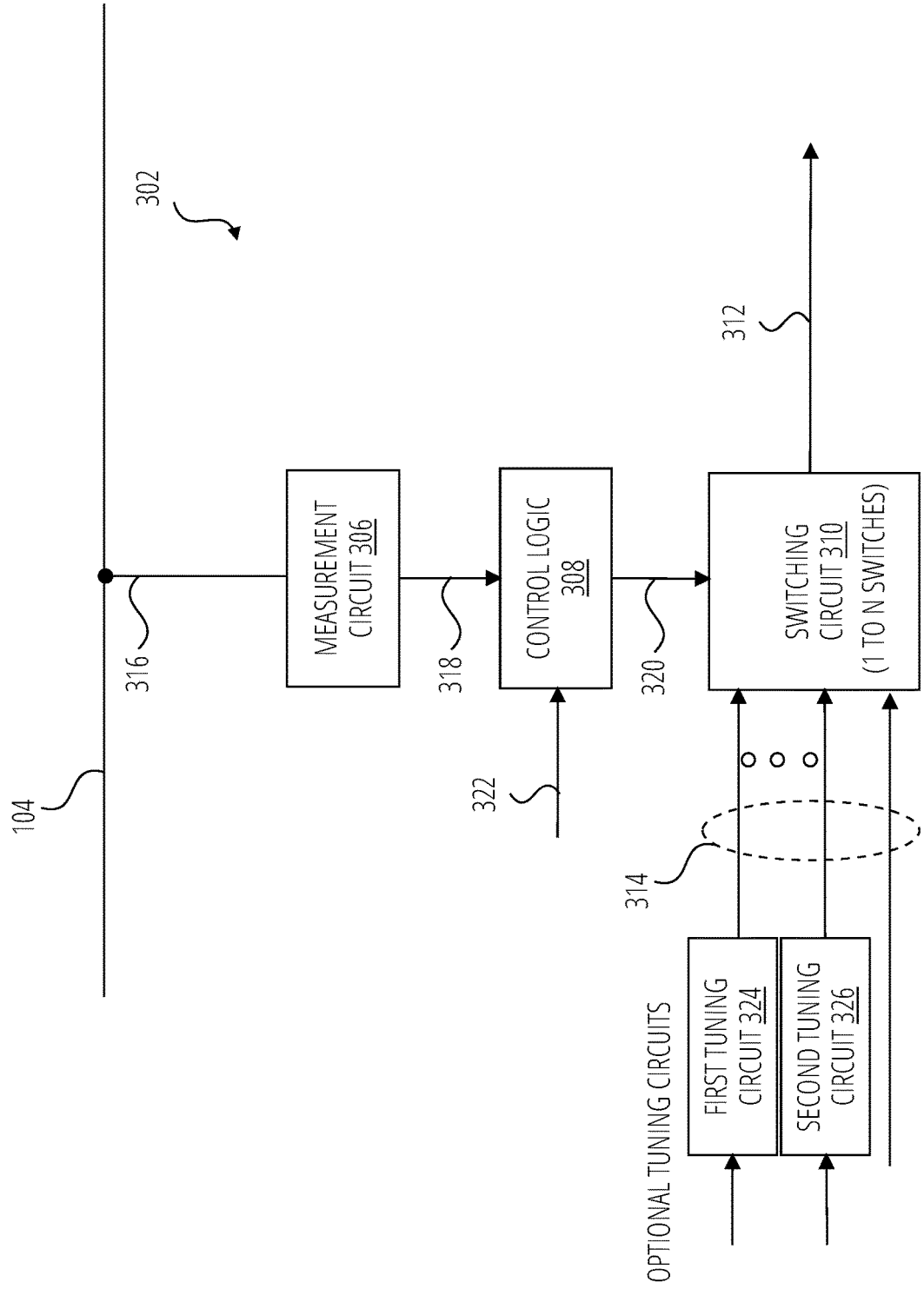
FIG. 3B is a block diagram depicting a biasing circuit in accordance with one or more embodiments.

FIG. 3B is a block diagram of a specific example of biasing circuit 302, in accordance with one or more embodiments. As indicated above, a similar circuitry may be provided for biasing circuit 304, or biasing circuit 302 may provide the functionality of both biasing circuit 302 and biasing circuit 304. Biasing circuit 302 includes a measurement circuit 306, a control logic 308 and a switching circuit 310. Biasing circuit 302 may optionally include tuning circuits (here, first tuning circuit 324 and second tuning circuit 326) configured to tune the available voltage levels (e.g., as discussed with respect to process 700, without limitation). Measurement circuit 306 is configured to generate a current measurement 318 in response to sensed current 316 at input node 104. In some embodiments, current measurement 318 may be, as non-limiting examples, a digital value or a signal exhibiting a signal level that corresponds to the level of sensed current 316. In other embodiments, current measurement 318 may be an asserted signal that indicates a quantity of sensed current 316 exceeds a specified threshold (i.e., an input current has a first state) or a de-asserted signal that indicates a quantity of sensed current 316 is smaller than a specified threshold (i.e., an input current has a second state), specified threshold signal not shown.

Control logic 308 may be configured to generate a control signal, switch control 320, in response to current measurement 318 and a control signal, bias mode 322, configuring control logic 308. By way of non-limiting example, bias mode 322 may be provided by a control register (not shown). By way of another non-limiting example, bias mode 322 may be an enablement signal, enabling one of multiple control logics that is associated with a desired bias mode. Switching circuit 310 may be configured to select one of the available bias voltage levels 314 (optionally tuned by first tuning circuit 324 or second tuning circuit 326) in response to the control signal, switch control 320, and provide a bias voltage 312 exhibiting the selected voltage level. In one embodiment, switching circuit 310 may comprise 1 to N switches, as required, to selectively provide the number of desired biasing voltage levels as bias voltage 312.

Figure 4:
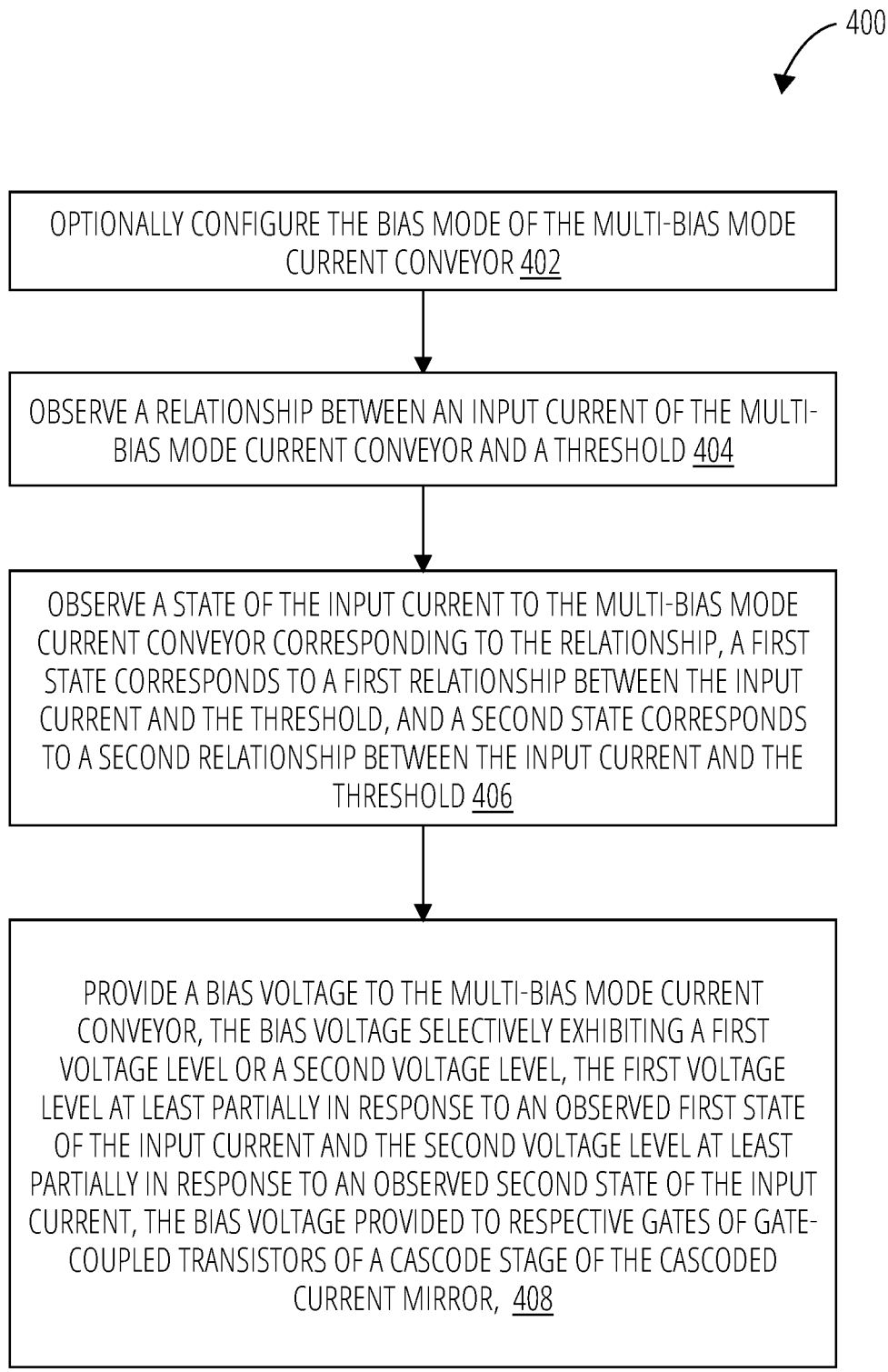
FIG. 4 is a flow diagram depicting a process for operating a multi-bias mode current conveyor, in accordance with one or more embodiments.

FIG. 4 is a flow diagram depicting a process 400 for operating a multi-bias mode current conveyor, in accordance with one or more embodiments.

At operation 402, process 400 optionally configures the bias mode of the multi-bias mode current conveyor. Configuration is optional in that the bias mode may already be configured when process 400 begins.

At operation 404, process 400 observes a relationship between an input current of the multi-bias mode current conveyor and a threshold.

At operation 406, process 400 observes a state of an input current to a multi-bias current conveyor (e.g., at nodes 136 or 140). A first observed state corresponds to a first relationship between the input current and a threshold (e.g., larger than the threshold, without limitation). A second observed state corresponds to a second relationship between the input current and the threshold (e.g., smaller than the threshold, without limitation).

At operation 408, process 400 provides a bias voltage to the multi-bias mode current conveyor. The bias voltage may be selectively exhibiting a first or a second voltage level. The bias voltage may be provided to respective gates of gate-coupled transistors of a cascode stage of the cascoded current mirror. The voltage level may be a first voltage level at least partially in response to an observed first state of the input current and a second voltage level at least partially in response to an observed second state of the input current. As indicated in relation to FIG. 3B, process 400 is illustrated in relation to a first or a second voltage level for the bias voltage, however this is not meant to be limiting in any way, and N voltage levels for the bias voltage may be provided, with the appropriate respective states of the input current, without exceeding the scope of this disclosure.

Figure 5:
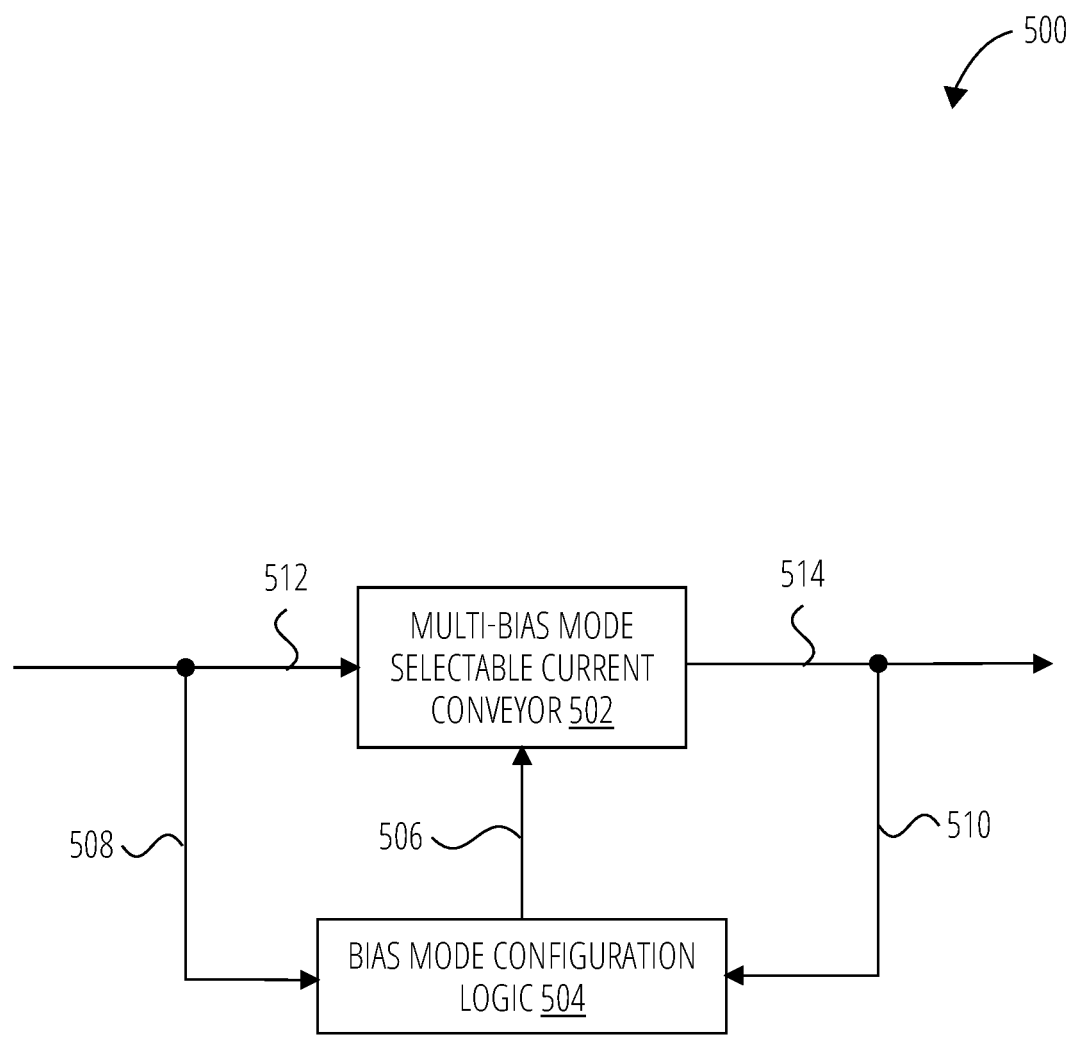
FIG. 5 is a block diagram depicting a system for configuring a bias mode of a current conveyor having multiple selectable bias modes, in accordance with one or more embodiments.

FIG. 5 is a block diagram depicting a system 500 for configuring a bias mode of a current conveyor having multiple selectable bias modes (e.g., multi-bias mode selectable current conveyor 502 depicted by FIG. 5), in accordance with one or more embodiments. In system 500, multi-bias mode selectable current conveyor 502 configures (e.g., programs, calibrates, tunes, or enables, without limitation) one or more internal bias modes at least partially in response to a control signal, configuration signal 506, provided by bias mode configuration logic 504.

During a contemplated configuration operation performed by system 500, bias mode configuration logic 504 observes input current 512 and output current 514 of multi-bias mode selectable current conveyor 502. Bias mode configuration logic 504 compares observed input current 508 and observed output current 510 to determine if multi-bias mode selectable current conveyor 502 operated within specified thresholds. If bias mode configuration logic 504 determines that multi-bias mode selectable current conveyor 502 did not operate within specified thresholds then bias mode configuration logic 504 configures the configuration signal 506 to be indicative of e.g., a different available bias mode than a previous bias mode, tuning of voltage levels associated with a bias mode, tuning of current thresholds associated with selecting a bias mode, or indicating turning ON or turning OFF switches S1 or S2, without limitation.

As non-limiting examples, bias mode configuration logic 504 may be an element of a multi-bias mode current conveyor, may be an element of an electronic system including a multi-bias mode current conveyor, may be an element of underlying logic circuitry of a chip that includes a multi-bias mode current conveyor, or may be an element of a test or configuration tool used, in whole or in part, to calibrate a multi-bias mode current conveyor.

As discussed above, when an input current is large, i.e., larger than a current amplitude threshold, if either of gate-coupled transistors P1 and P2 operate in a linear region, then the current mirrored at transistor P2 and more generally mirrored from input terminal 102 to output terminal 106 may be heavily influenced by, e.g., temperature and process variations, without limitation. Such influences may, and often do, result in inaccurate current copying and charge loss. Moreover, when a current amplitude is small (i.e., if Ipeak is smaller than a current amplitude threshold) and gate-coupled transistors P1 and P2 are in saturation region but do not have substantially equal Vds, then there may be inaccurate current mirroring from input terminal 102 to output terminal 106 due to a difference in $Vds_{p1}$ and $Vds_{p2}$. Such inaccurate current mirroring may introduce charge loss.

In one or more embodiments indications of inaccurate current mirroring such as charge loss, without limitation may be used to evaluate operation of a multi-bias mode current conveyor (e.g., within specified thresholds, without limitation). For example, charge loss may be detected at least partially in response to output current 514 being greater than input current 512, and inaccurate current mirroring may be detected at least partially responsive to detected charge loss.

Figure 6:
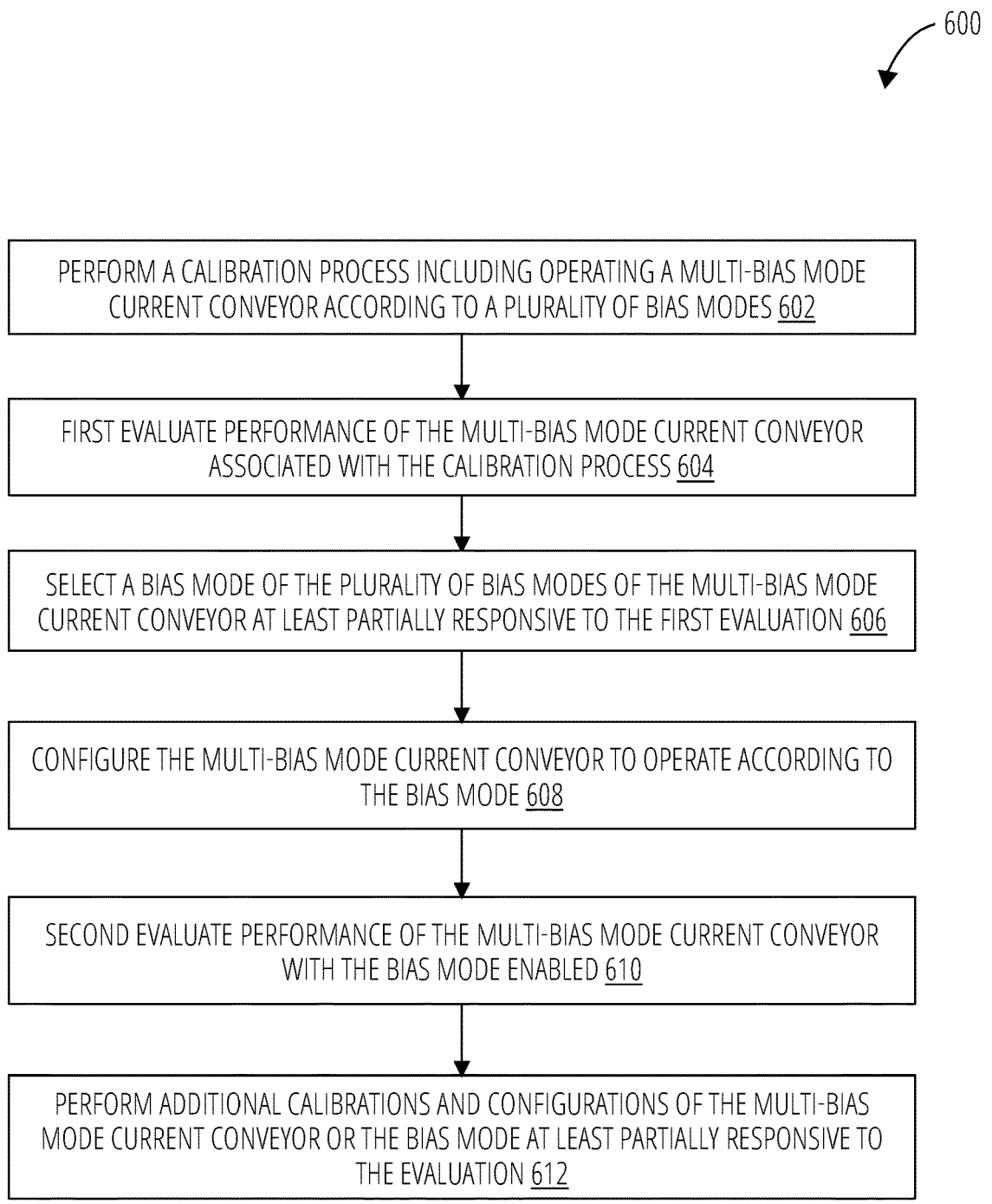
FIG. 6 is a flow diagram depicting a process for configuring a multi-bias mode current conveyor, in accordance with one or more embodiments.

FIG. 6 is a flow diagram depicting a process 600 for configuring a multi-bias mode current conveyor and bias modes thereof, in accordance with one or more embodiments.

At operation 602, process 600 performs a calibration process that includes operating a multi-bias mode current conveyor (such as multi-bias mode current conveyor 300, without limitation) according to a plurality of bias modes.

By way of non-limiting example, a calibration process may be a period during which the multi-bias mode current conveyor operates under the influence of a variety of real or artificially induced stimulus (e.g., interference, noise, and temperatures, without limitation), using one or more of the available bias modes. A multi-bias mode current conveyor and its individual transistors may be monitored and measured and performance indicators may be obtained.

At operation 604, process 600 performs a first evaluation (i.e., first evaluates) of the performance of the multi-bias mode current conveyor associated with the calibration process. As a non-limiting example, process 600 may observe, at least partially in response to the performance indicators, the degree to which each bias mode used in operation 602 is associated with operation of the multi-bias mode current conveyor within specified thresholds.

At operation 606, process 600 selects a bias mode of the plurality of bias modes at least partially responsive to the first evaluation. The bias mode selected by process 600 may be a bias mode observed to be most closely associated with operation of the multi-bias mode current conveyor within specified thresholds.

At operation 608, process 600 configures the multi-bias mode current conveyor to operate according to the bias mode selected in operation 606 enabled.

At operation 610, process 600 performs a second evaluation (i.e., second evaluates) of the performance of the multi-bias mode current conveyor, in this case with the bias mode selected in operation 606 enabled.

At operation 612, process 600 performs additional calibrations or configurations of the multi-bias mode current conveyor and/or the selected bias mode. In one or more embodiments, voltage levels of $Vbias_p$ and $Vbias_n$ may be tunable, and process 600 may tune the voltage levels of $Vbias_p$ and $Vbias_n$ to facilitate more accurate current mirroring (e.g., tuning the voltage levels for $Vbias_p$ and $Vbias_n$ till a suitable mirror current ratio is obtained, without limitation). By tuning the voltage levels of $Vbias_p$ and $Vbias_n$, process 600 may improve operation of a multi-bias mode current conveyor, as a non-limiting example, to cope with process variations or noise effects.

A person having ordinary skill in the art would understand that intermediate processes may be performed that include one or more of operations 602, 604, 606, 608, 610 or 612 (as well as other operations) without exceeding the scope of this disclosure. A person having ordinary skill in the art would understand that in some embodiments, process 600 may perform multiple iterations calibrations and configurations of the multi-bias mode current conveyor and/or bias mode and evaluation of the performance of the multi-bias mode current conveyor with the configured/calibrated multi-bias mode current conveyor and/or bias mode.

Figure 7:
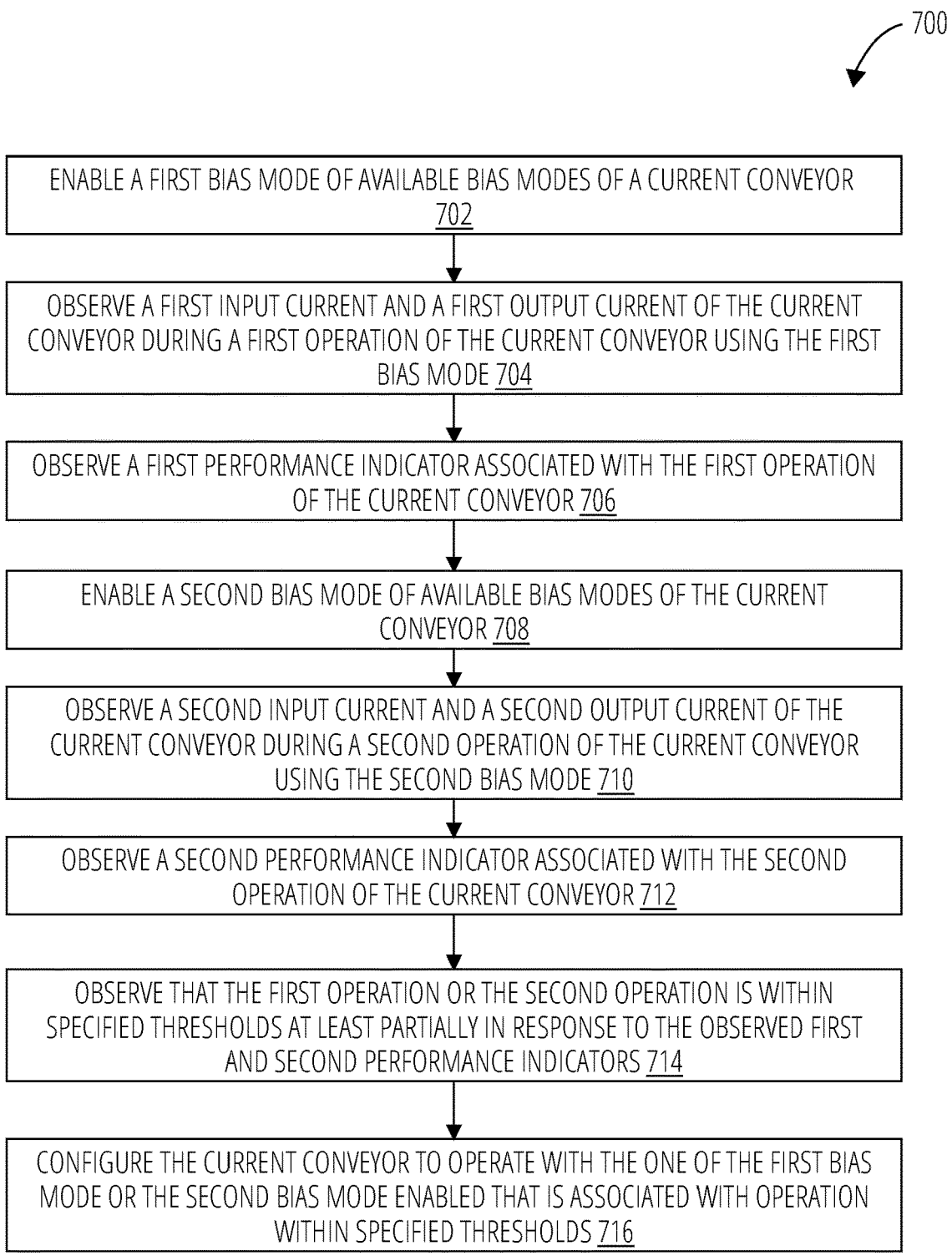
FIG. 7 is a flow diagram depicting a process for evaluating performance of a multi-bias mode current conveyor and configuring a multi-bias mode current conveyor, in accordance with one or more embodiments.

FIG. 7 is a flowchart depicting a process 700 for evaluating performance of a multi-bias mode current conveyor and configuring the bias mode of a multi-bias mode current conveyor (such as multi-bias mode current conveyor 300, without limitation), in accordance with one or more embodiments.

At operation 702, process 700 enables a first bias mode of the available bias modes of a current conveyor. Any of the available bias mode may be selected for the first bias mode.

At operation 704, process 700 observes a first input current and a first output current of the current conveyor during a first operation of the current conveyor using the first bias mode.

At operation 706, process 700 observes a first performance indicator associated with the first operation of current conveyor. Non-limiting examples of performance indicators include calculations indicative of inaccurate current mirroring (e.g., Iin and Iout exhibit a gain different than a desired gain, without limitation), such as charge less, without limitation, calculated in response to observed input and output currents.

At operation 708, process 700 enables a second bias mode of available bias modes of the current conveyor.

At operation 710, process 700 observes a second input current and a second output current of the current conveyor during a second operation of the current conveyor using the second bias mode.

At operation 712, process 700 observes a second performance indicator associated with the second operation of the current conveyor.

At operation 714, process 700 observes that the first operation or the second operation is within specified thresholds in response to the observed first and second performance indicators. As a non-limiting example, a threshold is specified such that a voltage expressed as threshold current amplitude*$Ron_{p3}$, and a voltage expressed as threshold current amplitude*($Ron_{p3}$+$Ron_{p1}$), are both smaller than a certain voltage level associated with P1 staying in a saturation region. As a non-limiting example, a threshold may be specified such that CMOS transistors of a cascode stage of a cascoded current mirror operate in a saturation region, and may correspond thereto.

At operation 716, process 700 configures the current conveyor to operate within the one of the first bias mode or the second bias mode, and more specifically, the one of the bias modes that is associated with operation within the specified thresholds in response to operation 714. Disclosed multi-bias mode current conveyors may have more than two available bias modes without exceeding the scope of this disclosure.

Figure 8:
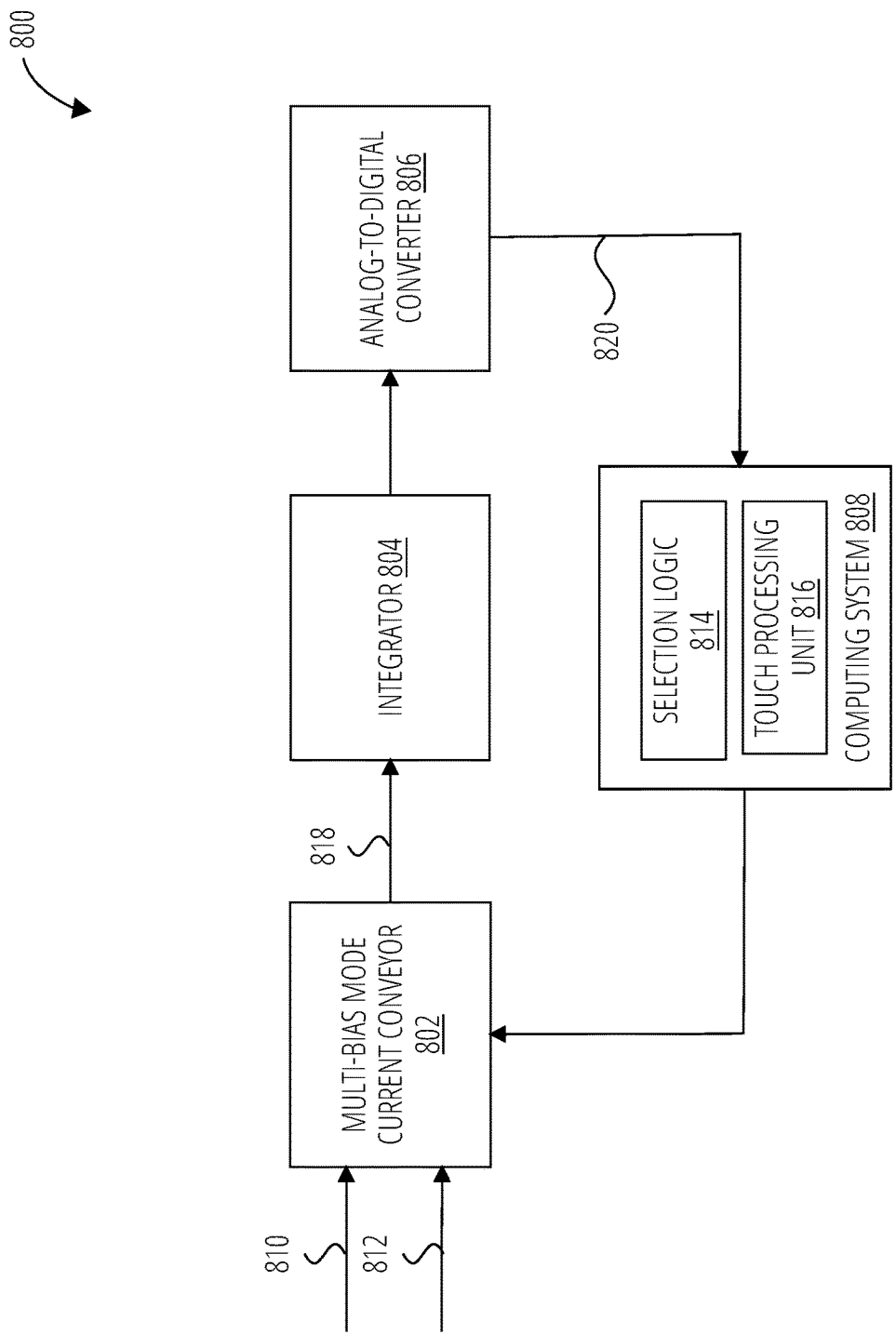
FIG. 8 is a block diagram depicting an example touch system application, in accordance with one or more embodiments.

FIG. 8 is a functional block diagram of a touch system 800, in accordance with one or more embodiments of the disclosure.

Signals corresponding to the three terminals of multi-bias mode current conveyor 802 (e.g., input terminal 102, reference terminal 110, and output terminal 106) are depicted—i.e., signals for a measurement current 810, reference voltage 812 and conveyed measurement current 818.

Multi-bias mode current conveyor 802, integrator 804, and analog-to-digital converter 806 form at least a portion of a signal chain of an input to touch processing unit 816 (e.g., a central processing unit (CPU) or processor without limitation) of computing system 808. As a non-limiting example, measurement current 810 may be received from a capacitive touch sensor node (not shown) coupled to an input of multi-bias mode current conveyor 802.

Notably, multi-bias mode current conveyor 802 may be a single multi-bias current conveyor or it may be a stage of two or more current conveyors in series, and some or a totality of the current conveyors in series is/are a multi-bias mode current conveyor.

During startup of touch system 800, a self-calibration scan may be performed by touch processing unit 816 that includes performing one or more test scans (e.g., measurements of a touch sensor coupled to touch system 800). Of these test scans, a first test scan may be configured to use a first bias mode and a second test scan may be configured to use a second bias mode. Stated another way, while performing the test scans, a first bias mode may be enabled by selection logic 814 at multi-bias mode current conveyor 802 during a first test scan and a second bias mode may be enabled by selection logic 814 at multi-bias mode current conveyor 802 while performing a second test scan.

Selection logic 814 may be configured to process digital measurement signals 820 received from analog-to-digital converter 806, compare results of performing the test scans using different bias modes, identify a test scan having best performance indicators, and enable a corresponding bias mode for normal operation of touch system 800 (i.e., for use during touch sensing).

Performing additional calibrations does not exceed the scope of this disclosure. As a non-limiting example, input measurement current conditions may change (e.g., a touch sensor may be used with a gloved finger or a wet environment, without limitation), so a self-calibration scan may be periodically run to auto-select a bias mode versus the digital measurement signals 820.

In various embodiments, any of touch system 800, computing system 808, and touch processing unit 816 may be implemented as a microcontroller system. In various embodiments, computing system 808 or touch processing unit 816 may be implemented by a touch controller of a touch sensing system.

Figure 9:
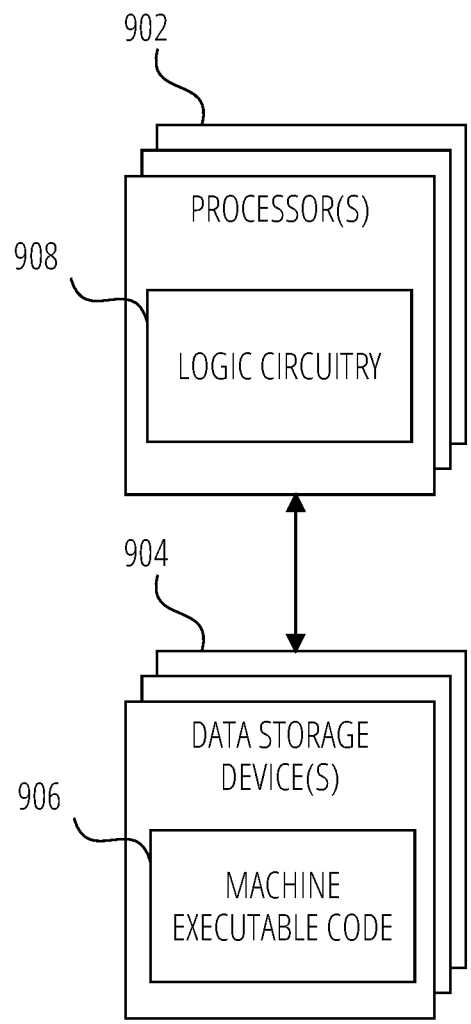
FIG. 9 block diagram of circuitry that, in some embodiments, may be used to implement various functions, operations, acts, processes, and/or methods disclosed herein.

FIG. 9 is a block diagram of circuitry 900 that, in some embodiments, may be used to implement various functions, operations, acts, processes, and/or methods disclosed herein. Circuitry 900 includes one or more processors 902 (sometimes referred to herein as "processors 902") operably coupled to one or more apparatuses such as data storage devices (sometimes referred to herein as "storage 904"), without limitation. Storage 904 includes machine-executable code 906 stored thereon (e.g., stored on a computer-readable memory) and processors 902 include logic circuitry 908. Machine-executable code 906 includes information describing functional elements that may be implemented by (e.g., performed by) logic circuitry 908. Logic circuitry 908 is adapted to implement (e.g., perform) the functional elements described by machine-executable code 906. Circuitry 900, when executing the functional elements described by machine-executable code 906, should be considered as special purpose hardware configured for carrying out functional elements disclosed herein. In some embodiments, processors 902 may be configured to perform the functional elements described by machine-executable code 906 sequentially, concurrently (e.g., on one or more different hardware platforms), or in one or more parallel process streams.

When implemented by logic circuitry 908 of processors 902, machine-executable code 906 is configured to adapt processors 902 to perform operations of embodiments disclosed herein. For example, machine-executable code 906 may be configured to adapt processors 902 to perform at least a portion or a totality of process 400, process 600, and process 700. As another example, machine-executable code 906 may be configured to adapt processors 902 to perform at least a portion or a totality of the operations discussed with reference to multi-bias mode current conveyor 300 including one or more of biasing circuits 302/304, current mirrors 122/130, cascode stages 124/128, and voltage follower 114. As another example, machine-executable code 906 may be configured to adapt processors 902 to perform at least a portion or a totality of the operations discussed with reference to measurement circuit 306, control logic 308, switching circuit 310, first tuning circuit 324, and second tuning circuit 326. As yet another example, machine-executable code 906 may be configured to adapt processors 902 to perform at least a portion or a totality of the operations discussed with reference to multi-bias mode selectable current conveyor 502 and bias mode configuration logic 504. As yet another example, machine-executable code 906 may be configured to adapt processors 902 to perform at least a portion or a totality of the operations discussed with reference to multi-bias mode current conveyor 802, integrator 804, analog-to-digital converter 806 and computing system 808 including selection logic 814 and touch processing unit 816.

As a specific, non-limiting example, the computer-readable instructions may be configured to instruct processors 902 to perform evaluate performance of a multi-bias mode current conveyor, select a bias mode in response to the evaluation, and perform additional evaluations of the performance of the multi-bias mode current conveyor and additional configurations and calibrations of the multi-bias mode current conveyor, as discussed herein.

Processors 902 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute computing instructions (e.g., software code) related to embodiments of the present disclosure. It is noted that a general-purpose processor (may also be referred to herein as a host processor or simply a host) may be a microprocessor, but in the alternative, processors 902 may include any conventional processor, controller, microcontroller, or state machine. Processors 902 may also be implemented as a combination of computing devices, such as a combination of a DSP and a microprocessor, a plurality of microprocessors, one or more microprocessors in conjunction with a DSP core, or any other such configuration.

In some embodiments, storage 904 includes volatile data storage (e.g., random-access memory (RAM)), non-volatile data storage (e.g., Flash memory, a hard disc drive, a solid state drive, erasable programmable read-only memory (EPROM), without limitation). In some embodiments, processors 902 and storage 904 may be implemented into a single device (e.g., a semiconductor device product, a system on chip (SOC), without limitation). In some embodiments, processors 902 and storage 904 may be implemented into separate devices.

In some embodiments, machine-executable code 906 may include computer-readable instructions (e.g., software code, firmware code). By way of non-limiting example, the computer-readable instructions may be stored by storage 904, accessed directly by processors 902, and executed by processors 902 using at least logic circuitry 908. Also by way of non-limiting example, the computer-readable instructions may be stored on storage 904, transmitted to a memory device (not shown) for execution, and executed by processors 902 using at least logic circuitry 908. Accordingly, in some embodiments, logic circuitry 908 includes electrically configurable logic circuitry 908.

In some embodiments, machine-executable code 906 may describe hardware (e.g., circuitry) to be implemented in logic circuitry 908 to perform the functional elements. This hardware may be described at any of a variety of levels of abstraction, from low-level transistor layouts to high-level description languages. At a high-level of abstraction, a hardware description language (HDL) such as an Institute of Electrical and Electronics Engineers (IEEE) Standard hardware description language (HDL) may be used, without limitation. By way of non-limiting examples, Verilog™, SystemVerilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of logic circuitry 908 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments, machine-executable code 906 may include an HDL, an RTL, a GL description, a mask level description, other hardware description, or any combination thereof.

In embodiments where machine-executable code 906 includes a hardware description (at any level of abstraction), a system (not shown, but including storage 904) may be configured to implement the hardware description described by machine-executable code 906. By way of non-limiting example, processors 902 may include a programmable logic device (e.g., an FPGA or a PLC) and logic circuitry 908 may be electrically controlled to implement circuitry corresponding to the hardware description into logic circuitry 908. Also by way of non-limiting example, logic circuitry 908 may include hard-wired logic manufactured by a manufacturing system (not shown, but including storage 904) according to the hardware description of machine-executable code 906.

Regardless of whether machine-executable code 906 includes computer-readable instructions or a hardware description, logic circuitry 908 is adapted to perform the functional elements described by machine-executable code 906 when implementing the functional elements of machine-executable code 906. It is noted that although a hardware description may not directly describe functional elements, a hardware description indirectly describes functional elements that the hardware elements described by the hardware description are capable of performing.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means some or a totality. As used herein, the term "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting embodiments of the disclosure include:

Embodiment 1: An apparatus, comprising: a first cascoded current mirror and a second cascoded current mirror arranged as a current conveyor; and a biasing circuit arranged to provide, to at least one of the first cascoded current mirror or the second cascoded current mirror, a bias voltage that selectively exhibits a first voltage level or a second voltage level.

Embodiment 2: The apparatus according to Embodiment 1, wherein the biasing circuit is arranged to: provide the bias voltage exhibiting the first voltage level at least partially responsive to a first state of an input current of the current conveyor; and provide the bias voltage exhibiting the second voltage level at least partially responsive to a second state of the input current of the current conveyor.

Embodiment 3: The apparatus according to any of Embodiments 1 and 2, wherein the first state of the input current corresponds to a first relationship between the input current and a threshold, and the second state of the input current corresponds to a second relationship between the input current and the threshold.

Embodiment 4: The apparatus according to any of Embodiments 1 through 3, wherein each of the first cascoded current mirror and the second cascoded current mirror comprises: a respective current mirror and a respective cascode stage.

Embodiment 5: The apparatus according to any of Embodiments 1 through 4, wherein the biasing circuit is arranged to provide the bias voltage to the respective cascode stage of the first cascoded current mirror or the second cascoded current mirror.

Embodiment 6: The apparatus according to any of Embodiments 1 through 5, wherein the first cascoded current mirror comprises: a first and second gate-coupled transistors of a first current mirror; and a third and fourth gate-coupled transistors of a first cascode stage, wherein the biasing circuit comprises switches arranged to alternately couple or de-couple respective gates of the third and fourth gate-coupled transistors of the first cascode stage to a first voltage source and a second voltage source.

Embodiment 7: The apparatus according to any of Embodiments 1 through 6, wherein respective gates of the first and second gate-coupled transistors of the first current mirror are coupled to a drain of the one of the third and fourth gate-coupled transistors of the first cascode stage that is arranged at a same side of the current conveyor as an input terminal of the current conveyor.

Embodiment 8: The apparatus according to any of Embodiments 1 through 7, wherein the second cascoded current mirror comprises: a first and second gate-coupled transistors of a second current mirror; and a third and fourth gate-coupled transistors of a second cascode stage, wherein the biasing circuit comprises switches arranged to alternately couple or de-couple respective gates of the third and fourth gate-coupled transistors of the second cascode stage to a third voltage source and a fourth voltage source.

Embodiment 9: The apparatus according to any of Embodiments 1 through 8, wherein respective gates of the first and second gate-coupled transistors of the second current mirror are coupled to a drain of the one of the third and fourth gate-coupled transistors of the second cascode stage that is arranged at a same side of current conveyor as an input terminal of the current conveyor.

Embodiment 10: The apparatus according to any of Embodiments 1 through 9, comprising a voltage follower arranged to apply a voltage at a reference terminal of the voltage follower to an input terminal of the current conveyor.

Embodiment 11: The apparatus according to any of Embodiments 1 through 10, wherein one of the first cascoded current mirror and second cascoded current mirror is configured as a P-channel transistor cascoded current mirror and another one of the first cascoded current mirror and the second cascoded current mirror is configured as an N-channel transistor cascoded current mirror.

Embodiment 12: The apparatus according to any of Embodiments 1 through 11, wherein the P-channel transistor cascoded current mirror and the N-channel transistor cascoded current mirror are arranged, respectively, to alternately provide a mirrored current to an output terminal of the current conveyor in a complimentary and commutating manner.

Embodiment 13: A method comprising: observing a state of an input current of a current conveyor; and providing, to the current conveyor, a bias voltage selectively exhibiting a first voltage level or a second voltage level at least partially responsive to the state of the input current.

Embodiment 14: The method according to Embodiment 13, wherein the observing the state of the input current of the current conveyor comprises: observing a relationship between the input current and a threshold; and observing the state of the input current of the current conveyor responsive to the relationship between the input current and the threshold.

Embodiment 15: The method according to any of Embodiments 13 and 14, wherein the observing the state of the input current of the current conveyor responsive to the relationship between the input current and the threshold comprises: observing, responsive to a first relationship between the input current and a threshold, a first state of the input current that is associated with one or more transistors of the current conveyor operating in a linear region; or observing, responsive to a second relationship between the input current and the threshold, a second state of the input current that is associated with one or more transistors of the current conveyor operating in a saturation region.

Embodiment 16: A system, comprising: a current conveyor configured to operate according to a plurality of selectable bias modes; and a bias mode configuration logic configured to configure the current conveyor at least partially responsive to an evaluation of a performance of the current conveyor.

Embodiment 17: The system according to Embodiment 16, wherein the bias mode configuration logic is configured to: perform a first evaluation of the performance of the current conveyor during a calibration process that includes operating the current conveyor according to the plurality of selectable bias modes; select a bias mode of the plurality of selectable bias modes at least partially responsive to the first evaluation; and perform a configuration of the current conveyor at least partially responsive to the bias mode.

Embodiment 18: The system according to any of Embodiments 16 and 17, wherein the bias mode configuration logic is configured to: perform a second evaluation of the performance of the current conveyor with a selected bias mode enabled; perform additional calibrations and configurations of the current conveyor or the selected bias mode at least partially responsive to the second evaluation, wherein the configuration of the current conveyor is at least partially responsive to the additional calibrations and configurations of the current conveyor.

Embodiment 19: A method, comprising: performing a calibration process, the calibration process including operating a multi-bias mode current conveyor according to a plurality of bias modes; evaluating a performance of the multi-bias mode current conveyor associated with calibration process; and configuring the multi-bias mode current conveyor at least partially responsive to the evaluating the performance of the multi-bias mode current conveyor.

Embodiment 20: The method according to Embodiments 18 and 19, wherein the configuring the multi-bias mode current conveyor at least partially responsive to the evaluating the performance of the multi-bias mode current conveyor comprises: configuring the multi-bias mode current conveyor to operate according to a bias mode that is associated with operation within specified thresholds.

Embodiment 21: The method according to any of Embodiments 19 and 20, comprising: enabling a first bias mode of the plurality of bias modes of the multi-bias mode current conveyor; observing a first input current and a first output current of the multi-bias mode current conveyor during a first operation of the multi-bias mode current conveyor using the first bias mode; observing a first performance indicator associated with the first operation of the multi-bias mode current conveyor; enabling a second bias mode of the plurality of bias modes of the multi-bias mode current conveyor; observing a second input current and a second output current of the multi-bias mode current conveyor during a second operation of the multi-bias mode current conveyor using the second bias mode; and observing a second performance indicator associated with the second operation of the multi-bias mode current conveyor, wherein the evaluating the performance of the multi-bias mode current conveyor is at least partially responsive to the first and the second performance indicators.

Embodiment 22: A touch system, comprising: a touch processing unit; a current conveyor arranged along a signal path of an input of the touch processing unit; and a selection logic configured to select one of a plurality of bias modes of the current conveyor for test scans performed by the touch processing unit.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a first cascoded current mirror and a second cascoded current mirror arranged as a current conveyor;
   a first biasing circuit arranged to provide, to the first cascoded current mirror, a first bias voltage, wherein the first biasing circuit to actively set the first bias voltage to exhibit either a first voltage level or a second voltage level; and
   a second biasing circuit arranged to provide to the second cascoded current mirror, a second bias voltage, wherein the second biasing circuit to actively set the second bias voltage to exhibit either a third voltage level or a fourth voltage level.

2. The apparatus of claim 1, wherein the first biasing circuit and the second biasing circuit are arranged to:
   respectively provide the first bias voltage or the second bias voltage respectively exhibiting the first voltage level or the third voltage level at least partially responsive to a first state of an input current of the current conveyor; and
   respectively provide the first bias voltage or the second bias voltage respectively exhibiting the second voltage level or the fourth voltage level at least partially responsive to a second state of the input current of the current conveyor.

3. The apparatus of claim 2, wherein the first state of the input current corresponds to a first relationship between the input current and a threshold, and the second state of the input current corresponds to a second relationship between the input current and the threshold.

4. The apparatus of claim 1, wherein each of the first cascoded current mirror and the second cascoded current mirror comprises: a respective current mirror and a respective cascode stage.

5. The apparatus of claim 4, wherein the first biasing circuit and the second biasing circuit are arranged to respectively provide the first bias voltage and the second bias voltage to the respective cascode stage of the first cascoded current mirror or the second cascoded current mirror.

6. The apparatus of claim 1, wherein the first cascoded current mirror comprises:
   a first and second gate-coupled transistors of a first current mirror; and
   a third and fourth gate-coupled transistors of a first cascode stage,
   wherein the first biasing circuit comprises switches arranged to alternately couple or de-couple respective gates of the third and fourth gate-coupled transistors of the first cascode stage to a first voltage source and a second voltage source.

7. The apparatus of claim 6, wherein respective gates of the first and second gate-coupled transistors of the first current mirror are coupled to a drain of the one of the third and fourth gate-coupled transistors of the first cascode stage that is arranged at a same side of the current conveyor as an input terminal of the current conveyor.

8. The apparatus of claim 6, wherein the second cascoded current mirror comprises:
   a first and second gate-coupled transistors of a second current mirror; and
   a third and fourth gate-coupled transistors of a second cascode stage,
   wherein the second biasing circuit comprises switches arranged to alternately couple or de-couple respective gates of the third and fourth gate-coupled transistors of the second cascode stage to a third voltage source and a fourth voltage source.

9. The apparatus of claim 8, wherein respective gates of the first and second gate-coupled transistors of the second current mirror are coupled to a drain of the one of the third and fourth gate-coupled transistors of the second cascode stage that is arranged at a same side of current conveyor as an input terminal of the current conveyor.

10. The apparatus of claim 1, comprising a voltage follower arranged to apply a voltage at a reference terminal of the voltage follower to an input terminal of the current conveyor.

11. The apparatus of claim 1, wherein one of the first cascoded current mirror and second cascoded current mirror is configured as a P-channel transistor cascoded current mirror and another one of the first cascoded current mirror and the second cascoded current mirror is configured as an N-channel transistor cascoded current mirror.

12. The apparatus of claim 11, wherein the P-channel transistor cascoded current mirror and the N-channel transistor cascoded current mirror are arranged, respectively, to alternately provide a mirrored current to an output terminal of the current conveyor in a complimentary and commutating manner.

13. A method comprising:
   determining a state of an input current of a current conveyor;
   providing, to the current conveyor, a first bias voltage selectively exhibiting a first voltage level or a second voltage level at least partially responsive to the state of the input current; and
   providing to the current conveyor, a second bias voltage selectively exhibiting a third voltage level or a fourth voltage level at least partially responsive to the state of the input current.

14. The method of claim 13, wherein the determining the state of the input current of the current conveyor comprises:
   determining a relationship between the input current and a threshold; and
   determining the state of the input current of the current conveyor responsive to the relationship between the input current and the threshold.

15. The method of claim 14, wherein the determining the state of the input current of the current conveyor responsive to the relationship between the input current and the threshold comprises:

determining, responsive to a first relationship between the input current and a threshold, a first state of the input current that is associated with one or more transistors of the current conveyor operating in a linear region; or determining, responsive to a second relationship between the input current and the threshold, a second state of the input current that is associated with one or more transistors of the current conveyor operating in a saturation region.

16. A system, comprising:
a current conveyor to operate according to a plurality of distinct, temporally non-overlapping, selectable bias modes; and
a bias mode configuration logic to:
configure the current conveyor at least partially responsive to performance indicators for the current conveyor; and
obtain first performance indicators for the current conveyor during a calibration process that includes operating the current conveyor according to the plurality of selectable bias modes.

17. The system of claim 16, wherein the bias mode configuration logic to:
select a bias mode of the plurality of selectable bias modes at least partially responsive to the first performance indicators; and
perform a configuration of the current conveyor at least partially responsive to the bias mode.

18. The system of claim 17, wherein the bias mode configuration logic to:
obtain second performance indicators for the current conveyor with a selected bias mode enabled; and
perform additional calibrations and configurations of the current conveyor or the selected bias mode at least partially responsive to the second performance indicators,
wherein the configuration of the current conveyor is at least partially responsive to the additional calibrations and configurations of the current conveyor.

19. A method, comprising:
performing a calibration process, the calibration process including operating a multi-bias mode current conveyor according to a plurality of distinct, temporally non-overlapping, selectable bias modes;
obtaining performance indicators for the multi-bias mode current conveyor associated with calibration process; and
configuring the multi-bias mode current conveyor at least partially responsive to the performance indicators for the multi-bias mode current conveyor.

20. The method of claim 19, wherein the configuring the multi-bias mode current conveyor at least partially responsive to the performance indicators for the multi-bias mode current conveyor comprises:
configuring the multi-bias mode current conveyor to operate according to a bias mode that is associated with operation within specified thresholds.

21. The method of claim 19, comprising:
enabling a first bias mode of the plurality of bias modes of the multi-bias mode current conveyor;
observing a first input current and a first output current of the multi-bias mode current conveyor during a first operation of the multi-bias mode current conveyor using the first bias mode;
observing a first performance indicator associated with the first operation of the multi-bias mode current conveyor;
enabling a second bias mode of the plurality of bias modes of the multi-bias mode current conveyor;
observing a second input current and a second output current of the multi-bias mode current conveyor during a second operation of the multi-bias mode current conveyor using the second bias mode; and
observing a second performance indicator associated with the second operation of the multi-bias mode current conveyor,
wherein the obtained performance indicators comprise at least the first and the second performance indicators.

22. A touch system, comprising:
a touch processing unit;
a current conveyor arranged along a signal path of an input of the touch processing unit; and
a selection logic configured to select one of a plurality of distinct, temporally non-overlapping bias modes of the current conveyor for test scans performed by the touch processing unit.

23. The apparatus of claim 3, comprising a logic circuit to:
detect the first state of the input current at least partially responsive to observation of the first relationship between the input current and the threshold;
detect the second state of the input current at least partially responsive to observation of the second relationship between the input current and the threshold,
and select the first biasing circuit or the second biasing circuit at least partially responsive to a detected state of the input current.

* * * * *